US011186749B2

(12) United States Patent
Kim et al.

(10) Patent No.: US 11,186,749 B2
(45) Date of Patent: Nov. 30, 2021

(54) SLURRY COMPOSITION AND METHOD OF MANUFACTURING INTEGRATED CIRCUIT DEVICE BY USING THE SAME

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Boyun Kim, Hwaseong (KR); Yeryung Jeon, Suwon (KR); Boun Yoon, Seoul (KR); Taek Dong Chung, Gwacheon (KR); Jae Gyeong Lee, Suwon (KR); Jin-Young Lee, Yongin (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/879,283

(22) Filed: May 20, 2020

(65) Prior Publication Data

US 2020/0392375 A1 Dec. 17, 2020

(30) Foreign Application Priority Data

Jun. 14, 2019 (KR) ........................ 10-2019-0071069

(51) Int. Cl.
*C09G 1/02* (2006.01)
*C09G 1/04* (2006.01)
(Continued)

(52) U.S. Cl.
CPC .................. *C09G 1/02* (2013.01); *B24B 1/00* (2013.01); *C09G 1/00* (2013.01); *C09G 1/04* (2013.01);
(Continued)

(58) Field of Classification Search
None
See application file for complete search history.

(56) References Cited

U.S. PATENT DOCUMENTS 7,161,247 B2    1/2007  De Rege Thesauro et al.
9,224,614 B2 *  12/2015 Shi ...................... H01L 21/3212
(Continued)

FOREIGN PATENT DOCUMENTS

CN    107604367 A      1/2018
CN    107880784    *  4/2018  ............... C09G 1/02
(Continued)

OTHER PUBLICATIONS

"Graphene Oxide" entry in Wikipedia, printed on Jan. 22, 2021 (Year: 2021).*

(Continued)

*Primary Examiner* — Jiong-Ping Lu
(74) *Attorney, Agent, or Firm* — Sughrue Mion, PLLC

(57) ABSTRACT

A slurry composition is disclosed which includes: a corrosion inhibitor including a material selected from carbon allotropes and derivatives thereof; and an oxidant. A method of manufacturing an integrated circuit device is disclosed which includes: forming a first metal film and a second metal film on a substrate, the first metal film and the second metal film respectively including different metals; and polishing, by using the slurry composition, a polishing target surface at which the first metal film and the second metal film are exposed.

18 Claims, 13 Drawing Sheets

(51) Int. Cl.
    *C09K 15/02* (2006.01)
    *H01L 21/768* (2006.01)
    *H01L 21/321* (2006.01)
    *C09G 1/00* (2006.01)
    *H01L 21/306* (2006.01)
    *C09K 3/14* (2006.01)
    *B24B 1/00* (2006.01)
    *C09G 1/06* (2006.01)
    *C09K 13/06* (2006.01)
    *B24B 37/04* (2012.01)

(52) U.S. Cl.
    CPC .............. *C09G 1/06* (2013.01); *C09K 3/1454* (2013.01); *C09K 3/1463* (2013.01); *C09K 13/06* (2013.01); *C09K 15/02* (2013.01); *H01L 21/30625* (2013.01); *H01L 21/3212* (2013.01); *H01L 21/7684* (2013.01); *H01L 21/76846* (2013.01); *H01L 21/76877* (2013.01); *B24B 37/044* (2013.01)

(56) References Cited

U.S. PATENT DOCUMENTS

| | | | |
|---|---|---|---|
| 9,299,585 | B2 | 3/2016 | Wang et al. |
| 10,253,216 | B2 | 4/2019 | Stender et al. |
| 2008/0105652 | A1 | 5/2008 | Brusie et al. |
| 2008/0148649 | A1 | 6/2008 | Liu |
| 2016/0035582 | A1 | 2/2016 | Li et al. |
| 2017/0267895 | A9 | 9/2017 | Shinoda et al. |
| 2018/0079989 | A1 | 3/2018 | Liang et al. |
| 2018/0273802 | A1 | 9/2018 | Granstrom et al. |

FOREIGN PATENT DOCUMENTS

| | | | | |
|---|---|---|---|---|
| JP | 2009256184 | * | 11/2009 | ............. B24B 37/00 |
| WO | WO2015147937 | * | 10/2015 | ........... C10M 111/00 |

OTHER PUBLICATIONS

Rafal Sitko et al., "Adsorption of divalent metal ions from aqueous solutions using graphene oxide", Dalton Transactions, vol. 42, The Royal Society of Chemistry Publishing, 2013, pp. 5682-5689.

* cited by examiner

SLURRY COMPOSITION AND METHOD OF MANUFACTURING INTEGRATED CIRCUIT DEVICE BY USING THE SAME

CROSS-REFERENCE TO RELATED APPLICATION

This application claims the benefit of Korean Patent Application No. 10-2019-0071069, filed on Jun. 14, 2019, in the Korean Intellectual Property Office, the disclosure of which is incorporated herein in its entirety by reference.

BACKGROUND

The present disclosure relates to a slurry composition and a method of manufacturing an integrated circuit device by using the slurry composition, and more particularly, to a slurry composition for chemical mechanical polishing (CMP) for forming metal wiring lines and to a method of manufacturing an integrated circuit device by using the slurry composition.

Due to the development of electronic technology, integrated circuit devices have been rapidly down-scaled, and line-widths and pitches of metal wiring layers included in integrated circuit devices also have been finer-sized. Therefore, there is a need to improve the lifespan and reliability of integrated circuit devices by minimizing physical damage to wiring structures including metal wiring layers.

SUMMARY

The present disclosure provides, in polishing a plurality of metal films respectively including heterogeneous metals, a slurry composition capable of preventing polishing loss due to galvanic corrosion of a particular metal film among the plurality of metal films while maintaining a good polishing rate of each of a plurality of metal films to provide excellent surface planarization.

The present disclosure also provides, in polishing a plurality of metal films respectively including heterogeneous metals to form metal wiring patterns, a method of manufacturing an integrated circuit device, the method allowing the reliability of the metal wiring patterns to be improved by preventing polishing loss due to galvanic corrosion of a particular metal film among the plurality of metal films while maintaining a good polishing rate of each of a plurality of metal films to provide excellent surface planarization.

According to an aspect of the present disclosure, there is provided a slurry composition, which includes: a corrosion inhibitor including a material selected from carbon allotropes or derivatives thereof; and an oxidant.

According to another aspect of the present disclosure, there is provided a slurry composition for chemical mechanical polishing (CMP) for polishing a metal-containing structure, where the metal-containing structure includes a first metal film and a second metal film, the first metal film including a first metal, and the second metal film including a second metal that is different from the first metal, the slurry composition including: a corrosion inhibitor, which has a chemical structure capable of selectively attaching to a surface of one selected from the first metal film and the second metal film and thereby inhibiting the corrosion of the selected metal film; and an oxidant, which has a chemical structure capable of oxidizing each of the first metal film and the second metal film, wherein the corrosion inhibitor includes a material selected from carbon allotropes or derivatives thereof.

According to yet another aspect of the present disclosure, there is provided a slurry composition for polishing a plurality of metal films respectively including heterogeneous metals, the slurry composition including: polishing particles, which are present in an amount that is greater than about 0 wt % and less than about 15 wt % based on a total weight of the slurry composition; a corrosion inhibitor, which includes a carbon allotrope derivative, which is a carbon allotrope that has been oxidized to include a plurality of hydrophilic groups containing an oxygen atom, and which is present in an amount of about 1 ppm to about 5000 ppm based on a total amount of the slurry composition; an oxidant, which is present in an amount of about 0.1 wt % to about 5 wt % based on the total weight of the slurry composition; and water.

According to yet another aspect of the present disclosure, there is provided a method of manufacturing an integrated circuit device, the method including: forming a first metal film and a second metal film on a substrate, the first metal film and the second metal film respectively including different metals; and polishing, by using a slurry composition, a polishing target surface at which the first metal film and the second metal film are exposed, wherein the slurry composition includes: a corrosion inhibitor including a material selected from carbon allotropes or derivatives thereof; and an oxidant.

According to yet another aspect of the present disclosure, there is provided a method of manufacturing an integrated circuit device, the method including: forming an interlayer dielectric on a substrate; forming a hole in the interlayer dielectric; forming a metal liner to cover the interlayer dielectric inside and outside the hole, the metal liner including a first metal; forming a main wiring layer to cover the metal liner inside and outside the hole, the main wiring layer including a second metal that is different from the first metal; exposing a portion of the metal liner around the main wiring layer by removing a portion of the main wiring layer; and polishing, by using a slurry composition, a polishing target surface at which the metal liner and the main wiring layer are exposed, wherein the slurry composition includes: a corrosion inhibitor including a material selected from carbon allotropes or derivatives thereof; and an oxidant.

According to yet another aspect of the present disclosure, there is provided a method of manufacturing an integrated circuit device, the method including: forming a first metal film and a second metal film on a substrate, the first metal film and the second metal film respectively including different metals; and polishing, by using a slurry composition, a polishing target surface at which the first metal film and the second metal film are exposed, wherein the slurry composition includes: a corrosion inhibitor, which includes a carbon allotrope derivative, which is a carbon allotrope that has been oxidized to include a plurality of hydrophilic groups containing an oxygen atom, and which is present in an amount of about 1 ppm to about 5000 ppm based on a total amount of the slurry composition; an oxidant, which is present in an amount of about 0.1 wt % to about 5 wt % based on a total weight of the slurry composition; and water.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
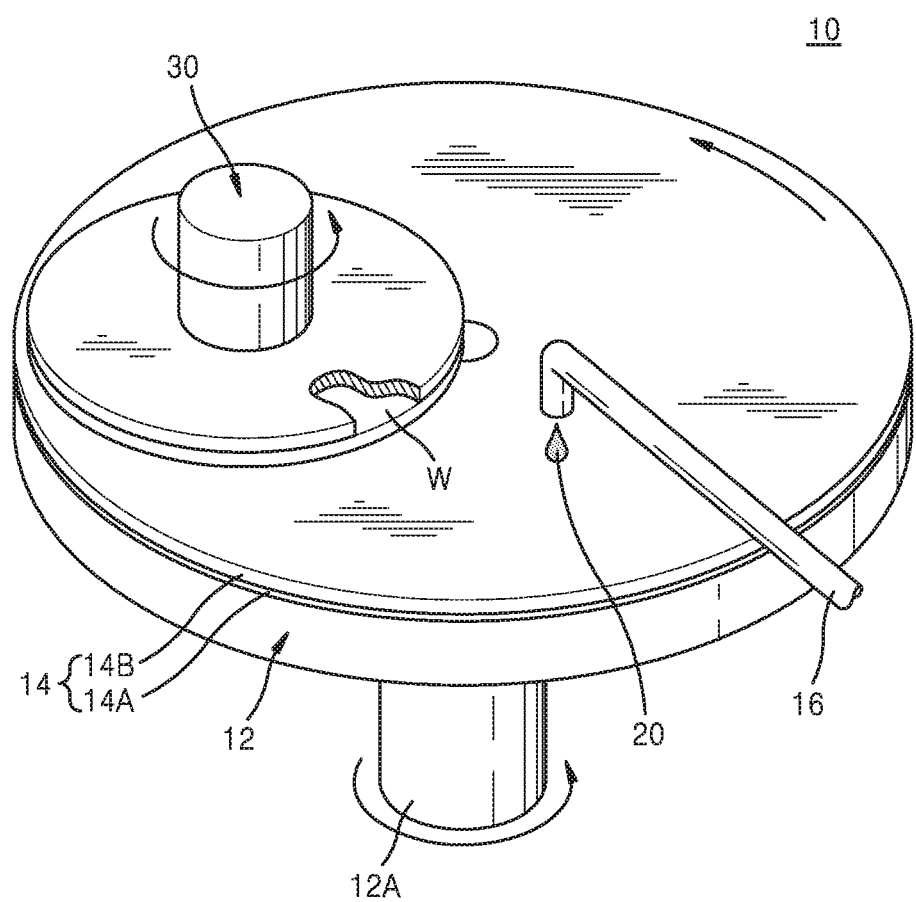
FIG. 1 is a schematic partially cut-away perspective view illustrating some components of a polishing apparatus according to embodiments of the present disclosure.

Hereinafter, embodiments of the present disclosure will be described in detail with reference to the accompanying drawings. Like components will be denoted by like reference numerals throughout the specification, and repeated descriptions thereof will be omitted.

As used herein, "about," "approximately," "substantially" and "significantly" will be understood by a person of ordinary skill in the art and will vary in some extent depending on the context in which they are used. If there are uses of the term which are not clear to persons of ordinary skill in the art given the context in which it is used, "about" and "approximately" will mean plus or minus <10% of particular term and "substantially" and "significantly" will mean plus or minus >10% of the particular term. "Comprising" and "consisting essentially of" have their customary meaning in the art. As used herein, each numerical range will be understood to be a shorthand disclosure of every discrete point within the range (thus, for example, a range of 1 to 10 is a description of all possible subranges within this range, such as a subrange of 3 to 5, a subrange of 6.5 to 7.5, etc.).

FIG. 1 is a schematic partially cut-away perspective view illustrating some components of a polishing apparatus according to embodiments of the present disclosure.

Referring to FIG. 1, a polishing apparatus 10 may be used to perform chemical mechanical polishing (CMP) on a surface of a substrate W. The polishing apparatus 10 of a rotating type is shown as an example in FIG. 1.

The polishing apparatus 10 includes a platen 12 and a polishing pad 14 attached to a top surface of the platen 12. The platen 12 may be mounted to be rotatable about a shaft 12A. The polishing pad 14 may include a support layer 14A and a polishing layer 14B. The support layer 14A may support the polishing pad 14 such that the polishing pad 14 may be attached to the platen 12 of the polishing apparatus 10.

The substrate W may include, for example, a wafer on which a polishing target film such as a metal, an insulating layer, or the like is formed. The substrate W may include various substrates such as a substrate for forming a semiconductor device, a substrate for forming a thin film transistor-liquid crystal display (TFT-LCD), a glass substrate, a ceramic substrate, a polymer substrate, and the like.

The polishing apparatus 10 includes a nozzle configured to supply a slurry composition 20 according to the present disclosure onto the polishing pad 14, and a head 30 on which the substrate W may be loaded. The head 30 may be configured to be rotatable. The head 30 may be configured to apply pressure to the substrate W toward the platen 12 while being rotated in a state in which the substrate W loaded on the head 30 faces the platen 12. Although only one head 30 is illustrated in FIG. 1, a plurality of heads 30 may be arranged over the polishing pad 14.

The slurry composition 20 may include a corrosion inhibitor, an oxidant, and water, the corrosion inhibitor including selected from carbon allotropes or derivatives thereof.

In example embodiments, the slurry composition 20 may be used to simultaneously polish a plurality metal films on the substrate W, the plurality of metal films respectively including heterogeneous metals. The plurality of metal films, which respectively include heterogeneous metals, may include a first metal film and a second metal film, which respectively include different metals. The oxidant may include a material capable of oxidizing each of the first metal film and the second metal film. The corrosion inhibitor may include a material, which is selectively attached to a surface of a positive-pole metal film selected, as being more vulnerable to galvanic corrosion, from the first metal film and the second metal film and thus inhibits the positive-pole metal film from being excessively corroded.

In example embodiments, the corrosion inhibitor may include a carbon allotrope derivative, which may be a carbon allotrope that has been subjected to an oxidation process (i.e., oxidized) to include a plurality of hydrophilic groups, where the hydrophilic groups can include a carboxyl group, a carbonyl group, an epoxy group, a hydroxyl group, a hydroperoxy group, a peroxy group, an isocyanate group, or a combination thereof. For example, the corrosion inhibitor may include a carbon allotrope derivative selected from a graphene oxide, an oxidized 3-dimensional carbon structure, a fullerenol, or a combination thereof. A carbon/oxygen atomic ratio (C:O) of a carbon allotrope derivative is not particularly limited. In some example embodiments, the C:O atomic ratio of the carbon allotrope derivative may be any value within the range of about 1:1 to about 16:1, such as a value within a range of about 1.5:1 to about 8:1, or a value within in a range of about 2:1 to about 5:1). Further, it is well known that the C:O ratio can be controlled by the method of synthesis. The C:O atomic ratio can be measured, for example, using an elemental analyzer and X-ray photoelectron spectroscopy.

Figure 2:
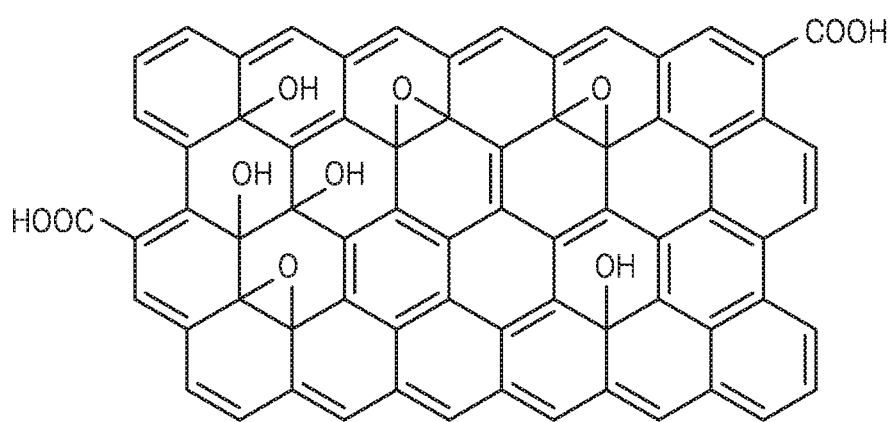
FIG. 2 is a diagram illustrating a schematic structure of graphene oxide, which may be used as a corrosion inhibitor included in a slurry composition according to the present disclosure.

FIG. 2 is a diagram illustrating a schematic structure of a graphene oxide, which is a well-known carbon allotrope derivative (i.e., a carbon allotrope (graphite) that has been subjected to a synthesis method to include, for example, a plurality of hydroxyl (—OH), carboxyl (—COOH) and epoxide groups (—O—)), and which may be used as a corrosion inhibitor included in a slurry composition according to embodiments of the present disclosure.

Although FIG. 2 illustrates an example of a structure of monolayer graphene oxide, the present disclosure is not limited to the example shown in FIG. 2. For example, graphene oxide constituting the corrosion inhibitor may be agglomerated by Van der Waals attractive force and thus be present as a bundle having a size of about tens of nanometers to about hundreds of nanometers. When graphene oxide is used as the corrosion inhibitor, graphene oxide having a sheet-shaped 2-dimensional structure may selectively passivate a particular metal film among a plurality of metal films included in a polishing target film. In addition, graphene oxide is abundant in hydrophilic functional groups such as carboxyl groups, hydroxyl groups, and the like, and thus, graphene oxide is highly adsorptive to metal cations. Hydrophilic functional groups included in graphene oxide may increase the solubility of graphene oxide with respect to water and may function such that graphene oxide may be adsorbed to cations in the slurry composition during a polishing process. For example, Cu ions may be more easily adsorbed to graphene oxide than ions of other metals. Therefore, graphene oxide may be adsorbed to a surface of a Cu film and thus passivate the Cu film. In addition, graphene oxide may be easily removed by cleaning after a polishing process and thus effectively applied to a polishing process.

When an oxidized 3-dimensional carbon structure is used as the corrosion inhibitor, the oxidized 3-dimensional carbon structure may include at least one selected from carbon nanotubes, carbon nanowires, carbon nanorods, carbon nanoneedles, and carbon nanoparticles. The carbon nanotubes may include single-walled carbon nanotubes (SWCNTs), double-walled carbon nanotubes (DWCNTs), or multi-walled carbon nanotubes (MWCNTs).

The slurry composition 20 includes the corrosion inhibitor including a material selected from carbon allotropes or derivatives thereof, whereby excessive corrosion of a metal film vulnerable to galvanic corrosion may be effectively suppressed, simultaneously with maintaining a good polishing rate of each of heterogeneous metal films on the substrate W to provide excellent surface planarization. The corrosion inhibitor may include only one selected from the example materials set forth above or may include a mixture of two or more selected therefrom.

The corrosion inhibitor may be present in an amount of about 1 ppm to about 5000 ppm based on a total amount of the slurry composition 20. In the case where the amount of the corrosion inhibitor is less than about 1 ppm in the slurry composition 20, when a plurality of metal films exposed at a polishing surface of the substrate W and respectively including heterogeneous metals are simultaneously polished, it may be difficult to maintain a good polishing rate of each of the plurality of metal films, and polishing loss due to galvanic corrosion may occur in a particular metal film among the plurality of metal films. In the case where the amount of the corrosion inhibitor is greater than about 5000 ppm in the slurry composition 20, when a plurality of metal films exposed at a polishing surface of the substrate W and respectively including heterogeneous metals are simultaneously polished, the selectivity for selectively preventing corrosion of a particular metal film vulnerable to galvanic corrosion among the plurality of metal films may be deteriorated.

In example embodiments, graphene oxide, which may be used as the corrosion inhibitor, may have an average thickness selected from a range that is greater than about 0 nm and equal to or less than about 30 nm, for example, an average thickness of about 10 nm or less. When the thickness of graphene oxide is too great, there may be a limit in effectively suppressing excessive corrosion of a meal film vulnerable to galvanic corrosion among polishing target films on the substrate W.

The oxidant may oxidize each of a plurality of metal films arranged on the substrate W and respectively including heterogeneous metals, thereby improving a polishing rate of each of the plurality of metal films.

In example embodiments, the oxidant may include a periodate, hydrogen peroxide, a nitric acid compound, a perhalogen acid, an organic peroxide, a permanganic acid compound, a dichromic acid compound, a persulfate, a percarbonate, a heteropoly acid, or the like, without being limited thereto. The periodate may include sodium periodate, potassium periodate, or periodic acid. The nitric acid compound may include nitric acid or iron nitrate. The perhalogen acid may include perchloric acid. The organic peroxide may include peracetic acid, perbenzoic acid, or tert-butylhydroperoxide. The permanganic acid compound may include potassium permanganate. The dichromic acid compound may include potassium dichromate. The persulfate may include sodium persulfate, potassium persulfate, or ammonium persulfate. The percarbonate may include sodium percarbonate or potassium percarbonate. However, a material, which may be used as the oxidant, is not limited to the examples set forth above. The oxidant may include only one material or may include a mixture of two or more materials.

The oxidant may be present in an amount of about 0.1 wt % to about 5 wt % based on the total weight of the slurry composition 20. When the amount of the oxidant is less than about 0.1 wt % in the slurry composition 20, a polishing rate may be too low due to insufficient oxidation of metal films on the substrate W, and when the amount of the oxidant is greater than about 5 wt %, because a polishing target surface may have recesses formed therein or have deteriorated roughness due to excessive oxidation of metal films on the substrate W, it may be difficult to obtain a result product having an intended shape.

Water included in the slurry composition 20 may include deionized water. The amount of water in the slurry composition 20 is not particularly limited, and water may be present in a balance amount, together with main components including the corrosion inhibitor and the oxidant, in the slurry composition 20.

The slurry composition 20 may further include polishing particles.

Each of the polishing particles may include a metal oxide. In example embodiments, the metal oxide may include at least one selected from silica, ceria, zirconia, alumina, titania, barium titania, germania, mangania, and magnesia. In example embodiments, the metal oxide may include a metal oxide coated with an organic or inorganic material, or a metal oxide in a colloidal state. Each of the polishing particles may have a spherical shape, a polyhedron shape, a needle shape, or a plate shape.

The polishing particles may have an average particle size of about 10 nm to about 300 nm. When the average particle size of the polishing particles is less than about 10 nm, a polishing rate of a polishing target film may be reduced. When the average particle size of the polishing particles is greater than about 300 nm, there may be a drawback in suppressing surface defects of a polishing target surface and controlling a polishing rate.

When the polishing particles are included in the slurry composition 20, the polishing particles may be present in an amount that is greater than about 0 wt % and less than about 15 wt % based on the total weight of the slurry composition 20. In one example, the polishing particles may be present in an amount of about 0.1 wt % to about 5 wt % based on the total weight of the slurry composition 20. The slurry composition 20 according to the present disclosure may exhibit excellent polishing performance for a polishing target film even when including a relatively small amount of the polishing particles.

The slurry composition 20 may have a pH selected from a range of about 7 to about 11. For example, the slurry composition 20 may have a pH selected from a range of about 9 to about 10.

The slurry composition 20 may further include a pH regulator adjusting the pH of the slurry composition 20. The pH regulator may include ammonia, potassium hydroxide, sodium hydroxide, magnesium hydroxide, rubidium hydroxide, cesium hydroxide, sodium hydrogen carbonate, sodium carbonate, triethanolamine, tromethamine, niacinamide, nitric acid, sulfuric acid, phosphoric acid, hydrochloric acid, acetic acid, citric acid, glutaric acid, glycolic acid, formic acid, lactic acid, malic acid, malonic acid, maleic acid, oxalic acid, phthalic acid, succinic acid, tartaric acid, ammonium methyl propanol (AMP), tetramethyl ammonium hydroxide (TMAH), or a combination thereof, without being limited thereto. The pH regulator may be present, in the slurry composition 20, in an amount needed to adjust the pH of the slurry composition 20 to a value required by the slurry composition 20, and the amount of the pH regulator is not particularly limited.

The slurry composition 20 may further include a polishing accelerator. The polishing accelerator may improve an oxidative capability of the oxidant.

In example embodiments, the polishing accelerator may include an organic acid, an amino acid, a chelating agent, a polymeric organic acid, or a combination thereof. The organic acid may be selected from among formic acid, picolinic acid, nicotinic acid, isonicotinic acid, fusaric acid, dinicotinic acid, dipiconilic dipicolinilic acid, lutidinic acid, quinolinic acid, glutamic acid, alanine, glycine, cystine, histidine, asparagine, guanidine, hydrazine, ethylenediamine, acetic acid, benzoic acid, oxalic acid, succinic acid, malic acid, maleic acid, malonic acid, citric acid, lactic acid, tricarballyic acid, tartaric acid, aspartic acid, glutaric acid, adipic acid, suberic acid, fumaric acid, phthalic acid, pyridinecarboxylic acid, and salts thereof. The amino acid may be selected from among glutamic acid, alanine, glycine, arginine, N-methylglycine, ethylglycine, lysine, and aspartic acid. The chelating agent may be selected from among ethylenediaminetetraacetic acid (EDTA), nitrilotriacetic acid (NTA), iminodiacetic acid (IDA), and quinolinic acid (QA). The polymeric organic acid may include polyacrylic acid (PAA).

The polishing accelerator may be present in an amount of about 0.01 wt % to about 10 wt % based on the total weight of the slurry composition 20. When the amount of the polishing accelerator in the slurry composition 20 is less than about 0.01 wt %, the polishing accelerator may have an insignificant effect of improving the oxidative capability of the polishing accelerator. When the amount of the polishing accelerator in the slurry composition 20 is greater than about 10 wt %, surface defects of a polishing target surface may be caused.

The slurry composition 20 may further include a dispersion stabilizer. The dispersion stabilizer may improve the dispersion stability of the corrosion inhibitor and/or the polishing particles, which are included in the slurry composition 20.

The dispersion stabilizer may include a nonionic polymer or a cationic organic compound. In example embodiments, the dispersion stabilizer may include at least one selected from ethylene oxide, ethylene glycol, glycol distearate, glycol monostearate, glycol polymerate, glycol ethers, alkylamine-containing alcohols, polymerate ether-containing compounds, vinyl pyrrolidone, celluloses, and ethoxylate-based compounds. For example, the dispersion stabilizer may be selected from among diethylene glycol hexadecyl ether, decaethylene glycol hexadecyl ether, diethylene glycol octadecyl ether, eicosaethylene glycol octadecyl ether, diethylene glycol oleyl ether, decaethylene glycol oleyl ether, decaethylene glycol octadecyl ether, nonylphenol polyethylene glycol ether, ethylenediamine tetrakis(ethoxylate-block-propoxylate) tetrol, ethylenediamine tetrakis(propoxylate-block-ethoxylate) tetrol, polyethylene-block-poly(ethylene glycol), polyoxyethylene isooctylphenyl ether, polyoxyethylene octylphenyl ether, polyoxyethylene tridecyl ether, polyoxyethylene sorbitan tetraoleate, polyoxyethylene sorbitol hexaoleate, polyethylene glycol sorbitan monolaurate, polyoxyethylene sorbitan monolaurate, sorbitan monopalmitate, an FS-300 nonionic fluorosurfactant, an FSN nonionic fluorosurfactant, an FSO nonionic ethoxylated fluorosurfactant, vinyl pyrrolidone, 2,4,7,9-tetramethyl-5-decyne-4,7-diol ethoxylate, 8-methyl-1-nonanol propoxylate-block-ethoxylate, allyl alcohol 1,2-butoxylate-block-ethoxylate, polyoxyethylene branched nonylcyclohexyl ether, and polyoxyethylene isooctylcyclohexyl ether, without being limited thereto.

The dispersion stabilizer may be present in an amount of about 0.001 wt % to about 1.0 wt % based on the total weight of the slurry composition 20. When the amount of the dispersion stabilizer in the slurry composition 20 is greater than about 1.0 wt %, there may be an adverse effect on polishing efficiency and/or dispersion stability.

The slurry composition 20 may further include a surfactant. The surfactant may reduce a contact angle of the slurry composition 20 with respect to a polishing target surface and may help a uniform polishing rate for the polishing target surface to be maintained.

The surfactant may include a nonionic surfactant, a cationic surfactant, an anionic surfactant, or an amphoteric surfactant. The surfactant may be present in an amount of about 0.001 wt % to about 0.5 wt % based on the total weight of the slurry composition 20. When the amount of the surfactant in the slurry composition 20 is greater than about 0.5 wt %, the efficiency of a polishing process may be deteriorated due to the generation of a large amount of foam.

The slurry composition 20 may further include a defoamer. The defoamer may suppress the generation of foam in the slurry composition 20 during a polishing process of the substrate W.

The defoamer may include a silicone defoamer or a non-silicone defoamer. The silicone defoamer may include a material containing a C1 to C5 polydialkylsiloxane. The non-silicone defoamer may include a material containing a C1 to C5 polyalkylene glycol. The amount of the defoamer is not particularly limited and may be appropriately adjusted according to the amount of the surfactant in use.

The slurry composition 20 may further include a leveling agent. The leveling agent may reduce the unevenness of a polishing target surface.

The leveling agent may be selected from ammonium chloride, ammonium lauryl sulfate, polyethylene glycol, triethanolamine polyoxyethylene alkyl ether sulfates, polyvinylpyrrolidone, and polyacrolein.

The leveling agent may be present in an amount of about 0.1 wt % to about 1.0 wt % based on the total weight of the slurry composition 20. When the amount of the leveling agent in the slurry composition 20 is greater than about 1.0 wt %, a polishing target surface may be damaged or the efficiency of a polishing process may be deteriorated.

The slurry composition 20 may further include an organic solvent. The organic solvent may improve wettability of a metal film among polishing target films, thereby further improving a polishing rate of the metal film.

The organic solvent may include a material mixable with water. In example embodiments, the organic solvent may be selected from glycols, derivatives of glycols, alcohols, and carbonic acid esters. For example, the organic solvent may be selected from ethylene glycol, propylene glycol, diethylene glycol, dipropylene glycol, triethylene glycol, tripropylene glycol, methanol, ethanol, propanol, n-butanol, n-pentanol, n-hexanol, isopropanol, 3-methoxy-3-methyl-1-butanol, acetone, methyl ethyl ketone, dimethylformamide, n-methylpyrrolidone, ethyl acetate, and ethyl lactate, without being limited thereto.

The organic solvent may be present in an amount of about 0.1 wt % to about 50 wt % based on the total weight of the slurry composition 20. When the amount of the organic solvent in the slurry composition 20 is greater than about 50 wt %, there may be an adverse effect on the stability of a polishing process, such as an increase in flammability.

In polishing a plurality of metal films, which respectively include heterogeneous metals, at a polishing target surface, the slurry composition 20 according to the present disclosure may prevent polishing loss due to galvanic corrosion of a particular metal film among the plurality of metal films while maintaining a good polishing rate of each of the plurality of metal films to provide excellent surface planarization.

Next, the present disclosure will be described in more detail with reference to evaluation examples, in which slurry compositions of examples according to the present disclosure and slurry compositions of comparative examples were evaluated in terms of functions and effects.

Evaluation Example 1

Evaluation of Effect of Selectively Preventing Corrosion by Slurry Composition

The effect of selectively preventing corrosion of a particular metal film vulnerable to galvanic corrosion among a plurality of metal films included in a polishing target film was evaluated by measuring the impedance of the plurality of metal films included in the polishing target film.

For this evaluation, a slurry composition (Example 1) according to the present disclosure and a slurry composition (Comparative Example 1) according to a comparative example were prepared. The slurry composition of Example 1 included 100 ppm of graphene oxide (obtained using "Highly Concentrated Graphene Oxide" from Graphene Supermarket; composition: carbon (79%), oxygen (20%), corresponding to a C:O atomic ratio of about 4:1) as a corrosion inhibitor, 2 wt % of $NaIO_4$ as an oxidant, and deionized water. In addition, the pH of the slurry composition of Example 1 was set to 9 by using NaOH. The slurry composition of Comparative Example 1 had the same composition as the slurry composition of Example 1 except that the slurry composition of Comparative Example 1 included 100 ppm of benzotriazole (BTA) instead of 100 ppm of graphene oxide.

In this evaluation, a three-electrode cell, which is a general electrochemical system, was used as an electrochemical cell for measuring impedance. Each of a ruthenium (Ru) thin film and a copper (Cu) thin film was formed on a silicon (Si) wafer and used as a working electrode, a platinum (Pt) coil was used as a counter electrode, and a KCl electrolyte, in which Ag/AgCl was dissolved, was used as a reference electrode. The area of each of the Ru thin film and the Cu thin film, which was exposed to the KCl electrolyte, was $0.25\ cm^2$.

Figure 3A:
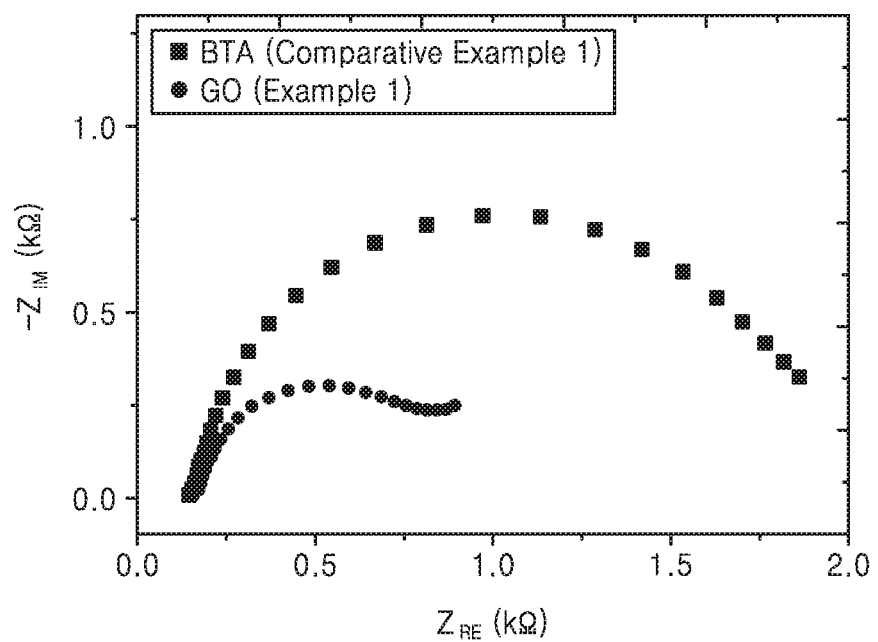
FIG. 3A is a graph depicting data of electrochemical impedance spectroscopy (EIS) experiments performed when a slurry composition of an example according to the present disclosure and a slurry composition of a comparative example were respectively applied to Ru thin films.
Figure 3B:
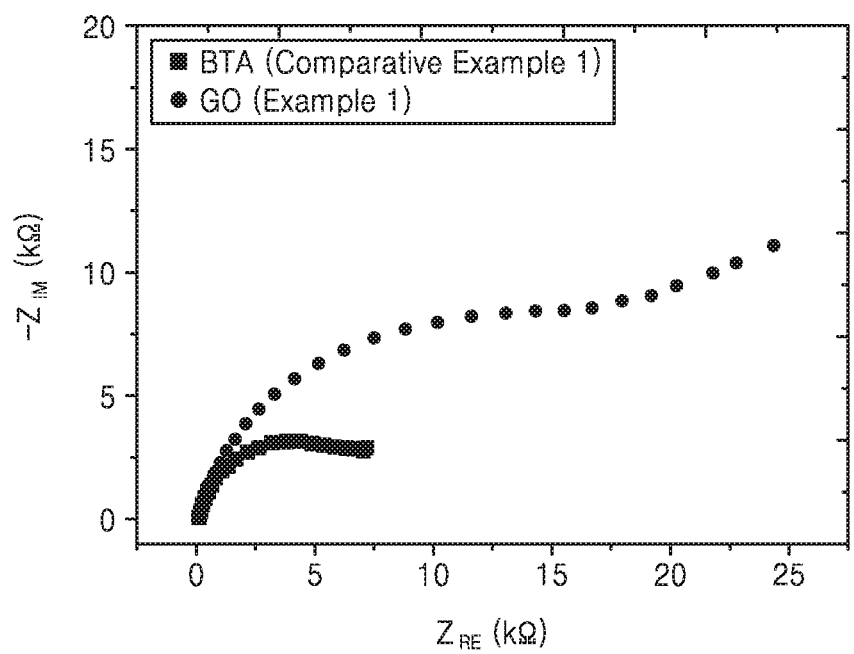
FIG. 3B is a graph depicting data of EIS experiments performed when a slurry composition of an example according to the present disclosure and a slurry composition of a comparative example were respectively applied to Cu thin films.

FIG. 3A is a graph depicting data of electrochemical impedance spectroscopy (EIS) experiments respectively performed when the slurry composition of Example 1 was applied to the Ru thin film ("GO") and when the slurry composition of Comparative Example 1 was applied to the Ru thin film ("BTA"). FIG. 3B is a graph depicting data of EIS experiments respectively performed when the slurry composition of Example 1 was applied to the Cu thin film ("GO") and when the slurry composition of Comparative Example 1 was applied to the Cu thin film ("BTA").

EIS measurement is a representative method of observing the electrochemical behavior of an electrode surface. A larger size of a semicircle shown in a Nyquist plot obtained as a result of impedance measurement indicates a lower rate of electrochemical reaction.

In FIG. 3A, when the Ru thin film was used, the diameter of a semicircle shown in a Nyquist plot was 1.6 kΩ in the case of BTA and was 0.7 kΩ in the case of GO. From these results, it was confirmed that an electrochemical reaction at a surface of the Ru thin film could occur more quickly in the case of GO than in the case of BTA.

In FIG. 3B, unlike when the Ru thin film was used, when the Cu thin film was used, the diameter of a semicircle shown in a Nyquist plot was 6.4 kΩ in the case of BTA and was 16.9 kΩ in the case of GO. From these results, it could be seen that, in the case of GO, an electrochemical reaction of the Cu thin film could be more effectively prevented.

From the results of FIGS. 3A and 3B, it could be confirmed that the case of GO showed a better passivation effect for protecting the Cu thin film than the case of BTA and also showed a better effect of selectively protecting the Cu thin film between the Ru thin film and the Cu thin film than the case of BTA.

Evaluation Example 2

Evaluation by Analysis of Grazing Incidence Angle X-Ray Diffraction (GIXRD)

When a slurry composition according to embodiments of the present disclosure was applied onto a Cu thin film and a Ru thin film each formed on a Si wafer, surface analysis was performed as follows, regarding whether a corrosion inhibitor included in the slurry composition remains on a surface of each of the Cu thin film and the Ru thin film or forms a protection layer on each of the Cu thin film and the Ru thin film.

For this evaluation, slurry compositions (Example 2-1 and Example 2-2) according to the present disclosure and a slurry composition (Comparative Example 2) according to a comparative example were prepared.

In 100 mL of the slurry composition of Example 2-1, 2.174 mg of graphene oxide (obtained using "Highly Concentrated Graphene Oxide" from Graphene Supermarket; composition: carbon (79%), oxygen (60%)) as a corrosion inhibitor, 6.522 mg of $NaIO_4$ as an oxidant, 347.8 mg of NaOH, 123.5 mg of $Na_2SO_4$ as both an electrolyte and a pH buffer, and a balance amount of deionized water were included. The slurry composition of Example 2-2 had the same composition as the slurry composition of Example 2-1 except that the slurry composition of Example 2-2 did not include $NaIO_4$. The slurry composition of Comparative Example 2 had the same composition as the slurry composition of Example 2-1 except that the slurry composition of Example 2-2 did not include graphene oxide. From the evaluation results of the slurry composition of Example 2-1 and the slurry composition of Example 2-2, a difference depending upon whether a slurry composition includes an oxidant or not could be confirmed.

Figure 4A:
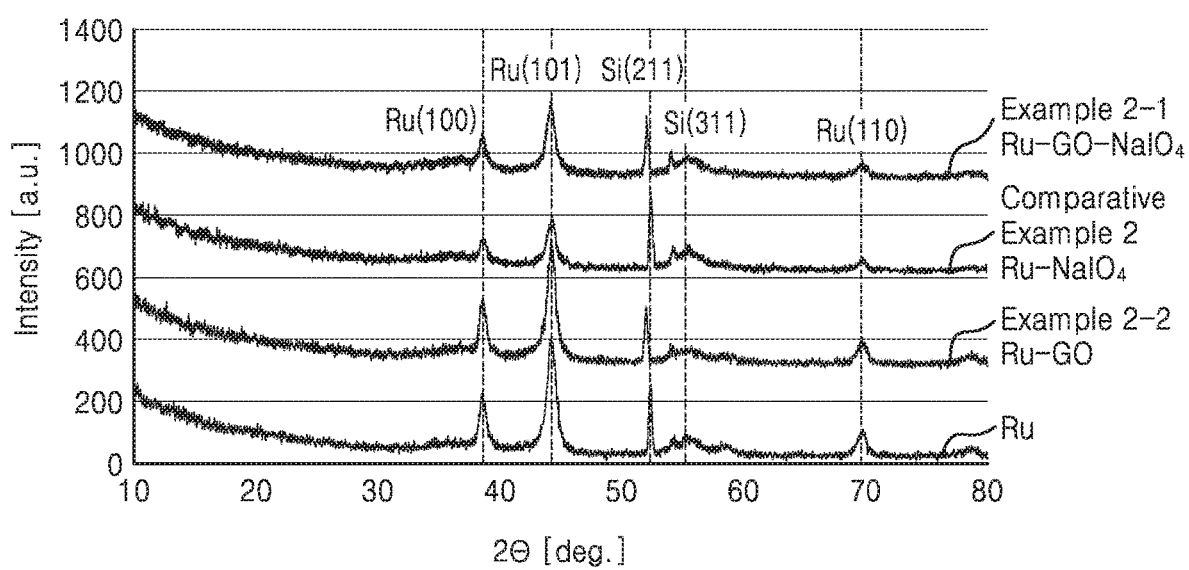
FIG. 4A is a spectrum illustrating results of grazing incidence angle x-ray diffraction (GIXRD) analysis performed when slurry compositions of examples according to the present disclosure and a slurry composition of a comparative example were respectively applied to Ru thin films.

FIG. 4A is a spectrum illustrating results of GIXRD analysis for each of the case where the slurry composition of Example 2-1 was applied to the Ru thin film ("Ru-GO-$NaIO_4$"), the case where the slurry composition of Example 2-2 was applied to the Ru thin film ("Ru-GO"), the case where the slurry composition of Comparative Example 2 was applied to the Ru thin film ("Ru—$NaIO_4$"), and the case where no treatment was performed on the Ru thin film ("Ru").

In the results of FIG. 4A, peaks corresponding to crystal structures of Ru and Si were observed in all the cases, and peaks corresponding to graphene oxide and Ru oxide were not observed. Even in the case of the slurry composition including $NaIO_4$ as an oxidant as in Example 2-1 and Comparative Example 2, although a reduction in magnitude of a peak corresponding to Ru was observed, a peak corresponding to Ru oxide was not observed. This is because $RuO_2.H_2O$ produced by the oxidant has an amorphous structure. Because a $RuO_2$ crystal structure is obtained by annealing $RuO_2.H_2O$ at a temperature of 200° C. or more for several hours, the peak corresponding to Ru oxide was not observed in the results of FIG. 4A. Therefore, the presence of $RuO_2$ could not be clearly identified from the results of FIG. 4A and would be able to be identified by XRD only after a $RuO_2$ crystal is formed through an annealing process. However, in the case of the slurry composition including $NaIO_4$ as an oxidant as in Example 2-1 and Comparative Example 2, the production of $RuO_2$ could be indirectly confirmed from a result in which the intensity of peaks of Ru was reduced. In addition, a peak of graphene oxide was also not observed in the results of FIG. 4A. As for this, it may be understood that, because graphene oxide had extremely small interactions with Ru or was dissolved in water to be swept away, graphene oxide was not observed on a Ru surface.

Figure 4B:
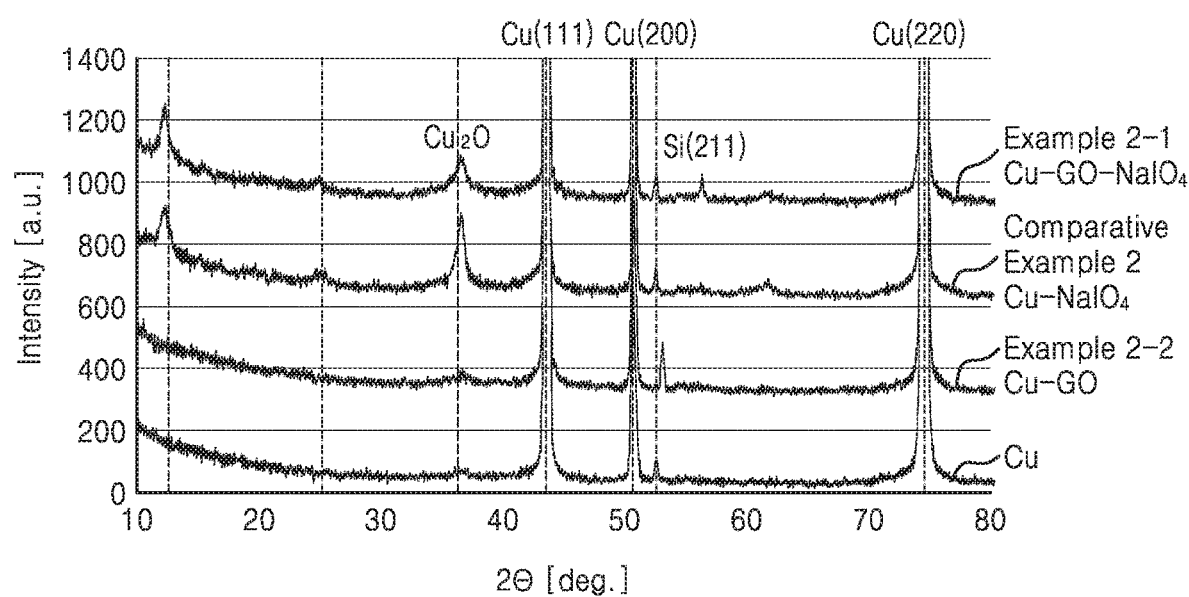
FIG. 4B is a spectrum illustrating results of GIXRD analysis performed when slurry compositions of examples according to the present disclosure and a slurry composition of a comparative example were respectively applied to Cu thin films.

FIG. 4B is a spectrum illustrating results of GIXRD analysis for each of the case where the slurry composition of Example 2-1 was applied to the Cu thin film ("Cu-GO-$NaIO_4$"), the case where the slurry composition of Example 2-2 was applied to the Cu thin film ("Cu-GO"), the case where the slurry composition of Comparative Example 2 was applied to the Cu thin film ("Cu—$NaIO_4$"), and the case where no treatment was performed on the Cu thin film ("Cu").

In the results of FIG. 4B, peaks corresponding to Cu were higher than those of Ru shown in FIG. 4A. This is because the thickness of the Cu thin film used for evaluation was greater than that of the Ru thin film.

In FIG. 4B, in the case of the slurry composition including $NaIO_4$ as an oxidant as in Example 2-1 and Comparative Example 2, a peak of $Cu_2O$ was higher than that in the cases of not including an oxidant. From these results, it could be seen that $Cu_2O$ was produced by the oxidant. In addition, in the case where the slurry composition including both an oxidant and graphene oxide as in Example 2-1 was used, it could be seen that the peak of $Cu_2O$ was reduced, as compared with the case where the slurry composition including an oxidant and not including graphene oxide as in Comparative Example 2 was used. It may be understood that this is because graphene oxide suppressed oxidation of a surface of the Cu thin film. In addition, it may be understood that the reason why graphene oxide was not observed at the surface of the Cu thin film is because, even when graphene oxide, together with Cu ions of the Cu thin film, formed complexes, graphene oxide was involved only in oxidation-reduction and polishing processes and dissolved in deionized water in the slurry composition to be swept away.

Further, in FIG. 4B, in the case of the slurry composition including $NaIO_4$ as an oxidant as in Example 2-1 and Comparative Example 2, new peaks appeared when 2θ was each of 13 degrees and 25 degrees, and it may be understood that this is because $Cu(IO_3)_2$ and $Cu(IO_4)_2$ compounds were produced by the oxidant. That is, it may be presumed that the peaks appearing when 2θ was each of 13 degrees and 25 degrees respectively correspond to $Cu(IO_3)_2$ and $Cu(IO_4)_2$.

Evaluation Example 3

Evaluation of Polishing Rate

A plurality of metal films included in a polishing target film were polished by using a slurry composition according to embodiments of the present disclosure, and a polishing rate of each of the plurality of metal films was evaluated.

For this evaluation, slurry compositions (Examples 3 and 4) according to the present disclosure and a slurry composition (Comparative Example 3) according to a comparative example were prepared. The slurry composition of Example 3 included 100 ppm of graphene oxide (obtained using "Highly Concentrated Graphene Oxide" from Graphene Supermarket; composition: carbon (79%), oxygen (20%)) as a corrosion inhibitor, 2 wt % of $NaIO_4$ as an oxidant, 2 wt % of silica as polishing particles, and deionized water. The slurry composition of Example 4 had the same composition as the slurry composition of Example 3 except that the slurry composition of Example 4 included 25 ppm of graphene oxide. In addition, a pH of each of the slurry compositions of Examples 3 and 4 was set to 9 by using NaOH. The slurry composition of Comparative Example 3 had the same composition as the slurry composition of Example 3 except that the slurry composition of Comparative Example 3 included 100 ppm of BTA instead of 100 ppm of graphene oxide.

Each of a Cu film and a Ru film was polished by using each of the slurry compositions of Example 3 and Comparative Example 3 while a polishing pressure of 1.5 psi was applied to each of the Cu film and the Ru film, and a removal rate of each of the Cu film and the Ru film by polishing was measured. As a result, in the case of Example 3, the removal rate of the Cu film was 562 Å/min, and the removal rate of the Ru film was 350 Å/min. On the other hand, in the case of Comparative Example 3, the removal rate of the Cu film was 1040 Å/min, and the removal rate of the Ru film was 332 Å/min. That is, the removal rate of the Cu film in the case of Example 3 was about half that in the case of Comparative Example 3, and the removal rate of the Ru film in the case of Example 3 was similar to that in the case of Comparative Example 3. From these results, it could be confirmed that a difference in terms of material between graphene oxide and BTA, which were used as the corrosion inhibitors in the slurry compositions, exerted almost no influence on the removal rate of the Ru film by polishing. Considering that graphene oxide generally has a property of forming a complex by bonding with metal cations, it could be seen from the above evaluation results that graphene oxide was more strongly adsorbed to Cu than to Ru to form a complex. That is, it may be understood that graphene oxide was more strongly bonded to Cu ions than to Ru ions to form a complex of graphene oxide with Cu, and the complex formed as such inhibited the Cu film from being polished, whereby the polishing rate of the Cu film was reduced.

Figure 5:
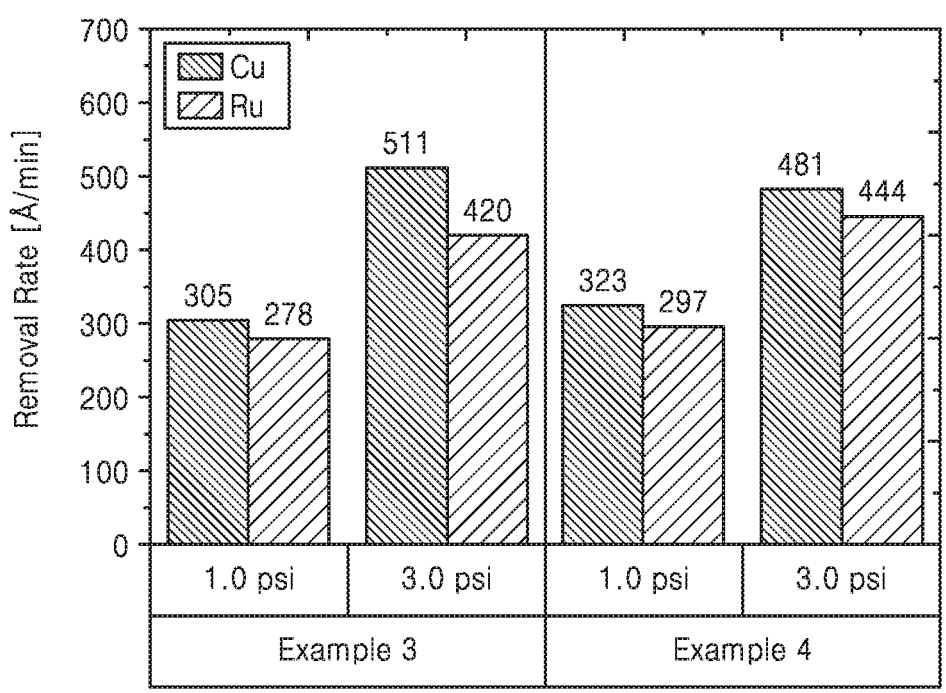
FIG. 5 is a graph depicting results obtained by evaluating influences exerted on polishing rates by amounts of corrosion inhibitors included in slurry compositions of examples according to the present disclosure as well as by pressures applied to polishing target films in polishing processes.

FIG. 5 is a graph depicting results obtained by evaluating influences exerted on polishing rates by the amounts of the corrosion inhibitors included in the slurry compositions of Examples 3 and 4 as well as by pressures applied to polishing target films in polishing processes.

To evaluate influences exerted on polishing rates by pressures and by amounts of corrosion inhibitors, each of a Cu film and a Ru film was polished by using each of the slurry compositions of Examples 3 and 4 while a polishing pressure of each of 1.0 psi and 3.0 psi was applied to each of the Cu film and the Ru film, and a removal rate of each of the Cu film and the Ru film by polishing was measured.

According to the results of FIG. 5, in the case where the slurry composition of Example 3 was used, a difference in removal rate between the Cu film and the Ru film when the polishing pressure was 1.0 psi was extremely small, and the polishing rate of each of the Cu film and the Ru film when the polishing pressure was 3.0 psi was increased to about 1.5 times the polishing rate thereof when the polishing pressure was 1.0 psi. In addition, in the case where the slurry composition of Example 4 was used, that is, the amount of graphene oxide was reduced to 0.25 times the amount thereof of Example 3, it was confirmed that a difference in removal rate between the Cu film and the Ru film when the polishing pressure was each of 1.0 psi and 3.0 psi was extremely small. From the results of FIG. 5, it could be confirmed that, even when the amount of graphene oxide was relatively small, there was a sufficient effect of selectively protecting the Cu film by graphene oxide.

Figure 6:
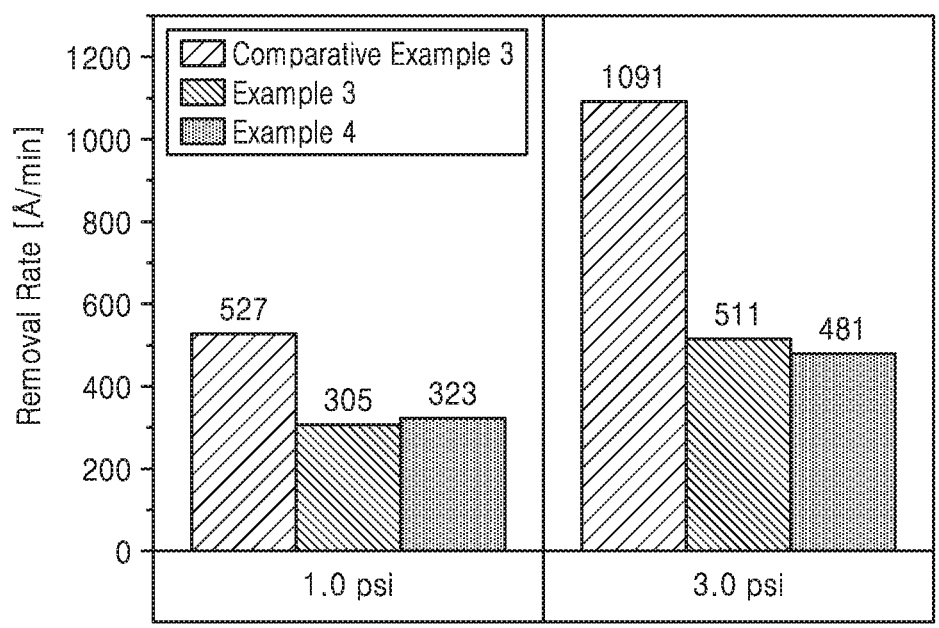
FIG. 6 is a graph depicting results obtained by evaluating influences exerted on polishing rates by types of corrosion inhibitors included in slurry compositions of examples according to the present disclosure as well as by pressures applied to polishing target films in polishing processes.

FIG. 6 is a graph depicting results obtained by evaluating influences exerted on polishing rates by the types of corrosion inhibitors included in the slurry compositions of Examples 3 and 4 as well as by pressures applied to polishing target films in polishing processes.

To evaluate influences exerted on polishing rates by pressures applied to polishing target films and by the types of corrosion inhibitors included in the slurry compositions, when the polishing pressure was each of 1.0 psi and 3.0 psi, a Cu film was polished by using each of the slurry composition of Example 3, which included 100 ppm of graphene oxide as a corrosion inhibitor, the slurry composition of Example 4, which included 25 ppm of graphene oxide as a corrosion inhibitor, and the slurry composition of Comparative Example 3, which included 100 ppm of BTA as a corrosion inhibitor.

In the results of FIG. 6, in the case where each of the slurry compositions of Examples 3 and 4 was used, it could be confirmed that the polishing rate of the Cu film when the polishing pressure was 3.0 psi was increased to about 1.5 times the polishing rate thereof when the polishing pressure was 1.0 psi. On the other hand, in the case where the slurry composition of Comparative Example 3 was used, the polishing rate of the Cu film when the polishing pressure was 3.0 psi was increased to about twice the polishing rate thereof when the polishing pressure was 1.0 psi. This means that BTA was adsorbed to a surface of the Cu film to form a passivation film at a certain pressure or less, and the passivation film was detached from the Cu film by pressure along with the increasing pressure, whereby a passivation capability with respect to the Cu film was deteriorated.

In polishing a polishing target surface of a wafer, which includes a plurality of metal films for forming various wiring patterns required by an integrated circuit device, a pressure applied to the polishing target surface may vary depending upon densities of the plurality of metal films formed at the polishing target surface. In this case, when a deviation of the passivation capability according to a pressure applied to the polishing target surface depending upon positions on the wafer in a polishing process is increased, the possibility of corrosion of a high step-height region may be increased. According to the slurry composition in accordance with embodiments of the present disclosure, the slurry composition includes, as a corrosion inhibitor, a material selected from carbon allotropes or derivatives thereof, and a particular metal film vulnerable to corrosion among the plurality of metal films may be selectively passivated by the corrosion inhibitor. Therefore, when the slurry composition according to embodiments of the present disclosure is used, global flatness of a wafer surface obtained after a polishing process may be improved, as compared with the case where a slurry composition including BTA is used.

FIGS. 7A to 7E are cross-sectional views illustrating sequential processes of a method of manufacturing an integrated circuit device, according to embodiments of the present disclosure.

Figure 7A:
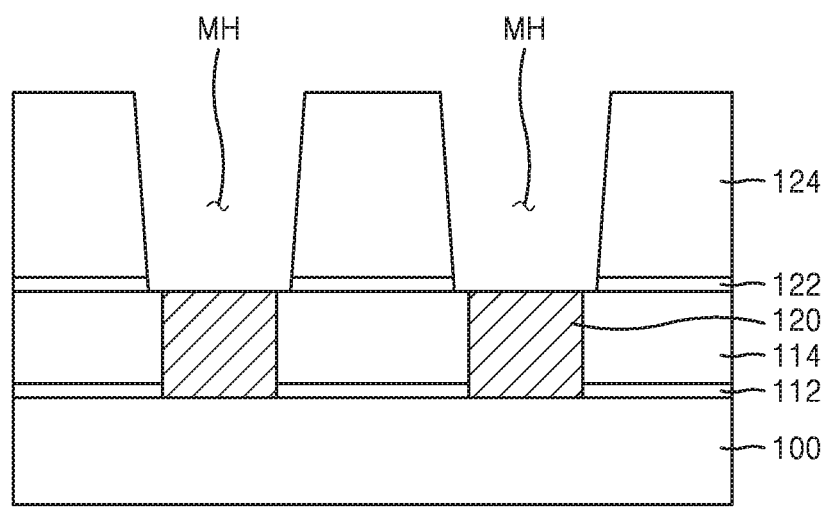
FIGS. 7A to 7E are cross-sectional views illustrating sequential processes of a method of manufacturing an integrated circuit device, according to embodiments of the present disclosure.

Referring to FIG. 7A, a first etch stop film 112 and a lower insulating film 114 are formed on a substrate 100, and a lower conductive film 120 is formed through the lower insulating film 114 and the first etch stop film 112, the lower conductive film 120 being able to be electrically connected to a conductive region (not shown) of the substrate 100.

The substrate 100 may include a semiconductor such as Si or Ge, or a compound semiconductor such as SiGe, SiC, GaAs, InAs, or InP. The substrate 100 may include circuit elements (not shown) such as a gate structure, an impurity region, a contact plug, and the like.

The first etch stop film 112 may include a material having etch selectivity that is different from that of the lower insulating film 114. For example, the first etch stop film 112 may include a silicon nitride film, a carbon-doped silicon nitride film, a carbon-doped silicon oxynitride film, a metal nitride film, or a combination thereof. The lower insulating film 114 may include a silicon oxide-based material. For example, the lower insulating film 114 may include plasma enhanced oxide (PEOX), tetraethyl orthosilicate (TEOS), boro-TEOS (BTEOS), phosphorous TEOS (PTEOS), boro-phospho-TESO (BPTEOS), borosilicate glass (BSG), phosphosilicate glass (PSG), borophosphosilicate glass (BPSG), or a combination thereof.

The lower conductive film 120 may include a metal film and a conductive barrier film surrounding the metal film. The metal film may include Cu, W, Al, Co, or a combination thereof. The conductive barrier film may include Ta, TaN, Ti, TiN, or a combination thereof. The lower conductive film 120 may be connected to a conductive region (not shown)

formed in the substrate 100, for example, to a source/drain region (not shown) of a transistor or to a gate electrode (not shown).

A second etch stop film 122 and an interlayer dielectric 124 are formed on the lower insulating film 114, and a hole MH is formed through the interlayer dielectric 124 and the second etch stop film 122, the hole MH exposing the lower conductive film 120.

More detailed configurations of the second etch stop film 122 and the interlayer dielectric 124 are substantially the same as those described regarding the first etch stop film 112 and the lower insulating film 114. In example embodiments, the interlayer dielectric 124 may include an insulating film having a dielectric constant that is lower than that of an insulating film constituting the lower insulating film 114. For example, the interlayer dielectric 124 may include an ultralow-K (ULK) film having an ultralow dielectric constant K of about 2.2 to about 2.4. The ULK film may include, for example, a SiOCN film, a SiOC film, a SiCOH film, or a combination thereof.

To form the hole MH in the interlayer dielectric 124, the interlayer dielectric 124 and the second etch stop film 122 may be dry-etched by using a plurality of etch mask patterns respectively having different etch selectivities.

Figure 7B:
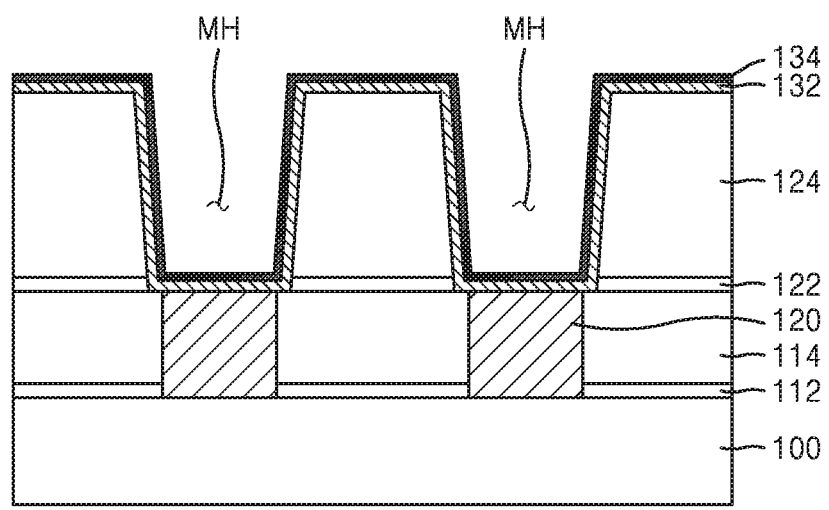

Referring to FIG. 7B, a conductive barrier film 132 and a metal liner 134 are sequentially formed in the hole MH of the interlayer dielectric 124 in this stated order. Each of the conductive barrier film 132 and the metal liner 134 may be formed to conformally cover surfaces of the interlayer dielectric 124 inside and outside the hole MH.

The conductive barrier film 132 may include Ta, TaN, Ti, TiN, or a combination thereof. The metal liner 134 may include a metal that is different from a metal included in the conductive barrier film 132. In example embodiments, the metal liner 134 may include Cu, Co, Ru, Ta, Ti, W, Mo, Ni, Mn, or a combination thereof.

To form the conductive barrier film 132 and the metal liner 134, a process including physical vapor deposition (PVD), chemical vapor deposition (CVD), atomic layer deposition (ALD), or a combination thereof may be used.

Figure 7C:
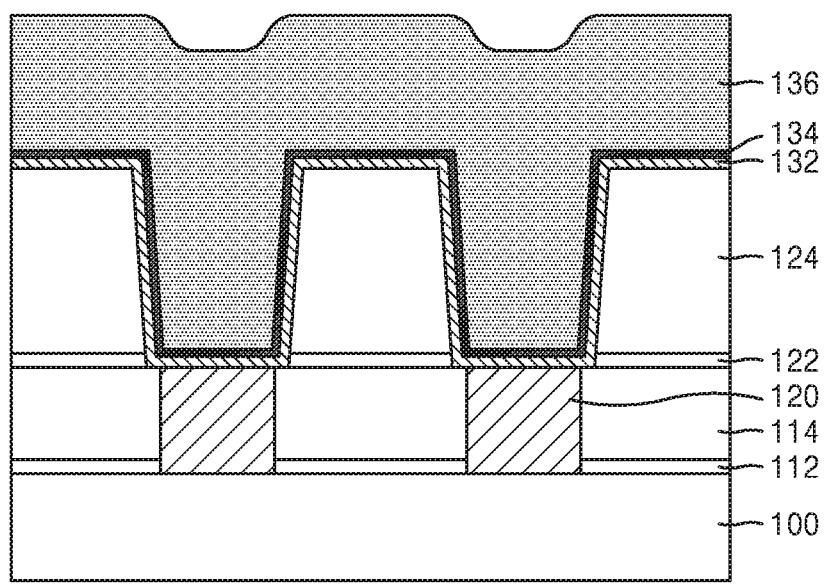

Referring to FIG. 7C, a main wiring layer 136 is formed on the result product of FIG. 7B to fill the hole MH. The main wiring layer 136 may be formed to cover the metal liner 134 inside and outside the hole MH.

The main wiring layer 136 may include a metal that is different from the metal included in the metal liner 134. The metal liner 134 and the main wiring layer 136 may respectively include metals having different work functions. In example embodiments, the main wiring layer 136 may be selected from Cu, Co, Ru, Ta, Ti, W, Mo, Ni, Mn, and combinations thereof. For example, the metal liner 134 may include Ru and the main wiring layer 136 may include Cu, without being limited thereto.

Figure 7D:
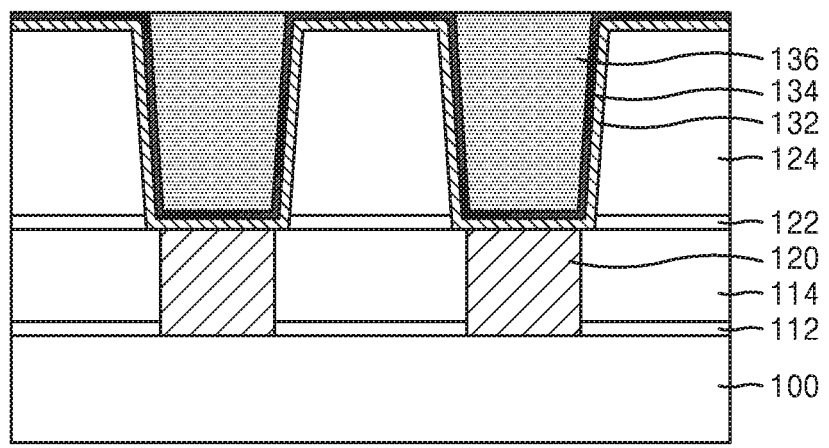

Referring to FIG. 7D, a portion of the metal liner 134 is exposed by removing a portion of the main wiring layer 136 from the result product of FIG. 7C. After the portion of the main wiring layer 136 is removed, the portion of the metal liner 134 may be exposed around the main wiring layer 136. The portion of the metal liner 134, which is exposed around the main wiring layer 136, may be a portion thereof covering a top surface of the interlayer dielectric 124 outside the hole MH.

To remove the portion of the main wiring layer 136 such that the portion of the metal liner 134 is exposed, a first polishing process may be performed. The first polishing process may include a CMP process using a first slurry composition. The first slurry composition is not particularly limited and may be any slurry composition without limitation so long as the first slurry composition is able to remove a metal constituting the main wiring layer 136. The first slurry composition may include a composition capable of providing a relatively high polishing rate of the metal constituting the main wiring layer 136. For example, the first slurry composition may include polishing particles including silica, and an oxidant including hydrogen peroxide, without being limited thereto.

Figure 7E:
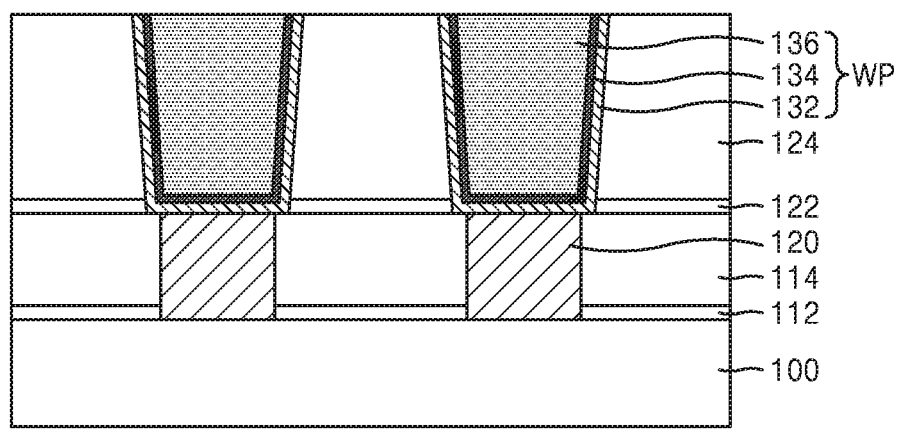

Referring to FIG. 7E, the result product of FIG. 7D is polished by using a second slurry composition, thereby exposing the top surface of the interlayer dielectric 124. As a result, a plurality of wiring patterns WP including the conductive barrier film 132, the metal liner 134, and the main wiring layer 136, which fill the hole MH of the interlayer dielectric 124, may be obtained.

The second slurry composition may have a different composition from the first slurry composition described with reference to FIG. 7D. The second slurry composition may have the same composition as the slurry composition 20 described with reference to FIG. 1.

While the polishing target surface, at which the metal liner 134 and the main wiring layer 136 are exposed, is polished by using the second slurry composition such that the top surface of the interlayer dielectric 124 is exposed, portions of the conductive barrier film 132 and the metal liner 134, which cover the top surface of the interlayer dielectric 124, and a portion of the main wiring layer 136 may be removed by polishing. During this process, a portion of the metal liner 134 and a portion of the main wiring layer 136 may be simultaneously polished by using the second slurry composition, and here, a polishing rate of the metal liner 134 may be approximately equal or similar to a polishing rate of the main wiring layer 136. After the metal liner 134 over the top surface of the interlayer dielectric 124 is removed and the conductive barrier film 132 is exposed, a portion of the conductive barrier film 132 and another portion of the main wiring layer 136 may be simultaneously polished, and here, a polishing rate of the conductive barrier film 132 may be approximately equal or similar to the polishing rate of the main wiring layer 136. After the top surface of the interlayer dielectric 124 is exposed, the plurality of wiring patterns WP including the conductive barrier film 132, the metal liner 134, and the main wiring layer 136, which fill the hole MH of the interlayer dielectric 124, may be obtained.

In general, when a plurality of metal films respectively including different metals are exposed together at a polishing target surface of a substrate and brought into contact with a slurry composition, a galvanic effect may be caused. The galvanic effect refers to a phenomenon in which, when two metals of different types are close to each other, electricity is generated as a current flows according to the generation of a voltage due to a difference in electric potential between the two metals. As such, due to a difference in work function at an interface between two metals of different types, which electrically contact each other, one metal having higher activity and lower electric potential acts as a positive pole, and the other metal having lower activity and higher electric potential acts as a negative pole. Here, when the two metals are exposed to a slurry composition including a corrosive solution, corrosion may occur in the two metals due to a difference in electric potential between the two metals, and thus, galvanic corrosion may occur. Here, the positive-pole metal having higher activity may be corroded faster than when being alone, and the negative-pole metal having lower activity may be corroded relatively slow.

When a polishing target surface, at which the metal liner 134 and the main wiring layer 136 are exposed, is polished by using a general slurry composition, a polishing rate of the main wiring layer 136 may be excessively high due to galvanic corrosion of the main wiring layer 136, and thus, due to an imbalance in polishing rate between the main wiring layer 136 and the metal liner 134, the flatness of a polished surface of the substrate 100 after a polishing process may be deteriorated, and the reliability of the wiring patterns WP may also be deteriorated.

In particular, when one of the metal liner 134 and the main wiring layer 136 includes a noble metal and the other includes a metal that is not a noble metal, the noble metal is relatively unlikely to be oxidized because the noble metal generally has stable properties with respect to chemical materials. Therefore, a strong oxidant for oxidizing the noble metal may be included in the slurry composition, and in this case, a difference in polishing rate between the metal liner 134 and the main wiring layer 136 may be significantly increased. For example, when the metal liner 134 includes a Ru film and the main wiring layer 136 includes a Cu film, a difference in polishing rate between the Ru film and the Cu film may cause dishing or corrosion in wiring patterns obtained after polishing and thus cause an increase or imbalance in resistance of the wiring patterns.

Unlike in the general case described above, because the slurry composition 20 (see FIG. 1) according to the present disclosure includes, as a corrosion inhibitor, a material, for example, a graphene oxide, selected from carbon allotropes or derivatives thereof, when a polishing target surface, at which both the metal liner 134 and the main wiring layer 136 are exposed, is polished by using the slurry composition 20, polishing loss due to galvanic corrosion of a component selected, as acting as a positive pole having higher activity, from the metal liner 134 and the main wiring layer 136 is effectively prevented while an improved polishing rate of each of the metal liner 134 and the main wiring layer 136 is provided, whereby the flatness of a polished surface (or surface planarization) may be improved in a result product in which the plurality of wiring patterns WP are obtained after a polishing process, and as a result, the plurality of wiring patterns WP having improved reliability may be obtained.

While the present disclosure has been particularly shown and described with reference to embodiments thereof, it will be understood that various changes in form and details may be made therein without departing from the spirit and scope of the following claims.

What is claimed is:

1. A slurry composition comprising:
   a corrosion inhibitor comprising a carbon allotrope derivative; and
   an oxidant,
   wherein the carbon allotrope derivative comprises a plurality of hydrophilic groups selected from the group consisting of a carboxyl group, a carbonyl group, an epoxy group, a hydroxyl group, a hydroperoxy group, a peroxy group, and an isocyanate group;
   a carbon/oxygen atomic ratio (C:O) of the carbon allotrope derivative is 2:1 to 5:1;
   the carbon allotrope derivative is present in an amount of 1 ppm to 5000 ppm based on a total amount of the slurry composition; and
   the carbon allotrope derivative comprises an oxidized 3-dimensional carbon structure.

2. The slurry composition of claim 1, wherein the carbon allotrope derivative further comprises a graphene oxide and/or a fullerenol.

3. The slurry composition of claim 1, wherein the carbon allotrope derivative further comprises graphene oxide having an average thickness selected from a range that is greater than 0 nm and equal to or less than 30 nm.

4. The slurry composition of claim 1, wherein the oxidant comprises a periodate.

5. The slurry composition of claim 1, wherein the slurry composition has a pH selected from a range of 7 to 11.

6. The slurry composition of claim 1, further comprising: polishing particles.

7. The slurry composition of claim 6, wherein each of the polishing particles comprises a metal oxide.

8. The slurry composition of claim 1, further comprising:
   at least one selected from the group consisting of a pH regulator, a polishing accelerator, a dispersion stabilizer, a surfactant, a defoamer, and a leveling agent.

9. A slurry composition for chemical mechanical polishing (CMP) for polishing a metal-containing structure, the metal-containing structure comprises a first metal film and a second metal film, the first metal film comprising a first metal, and the second metal film comprising a second metal that is different from the first metal, the slurry composition comprising:
   a corrosion inhibitor, which has a chemical structure capable of selectively attaching to a surface of one selected from the first metal film and the second metal film and thus inhibits corrosion of the selected metal film; and
   an oxidant, which has a chemical structure capable of oxidizing each of the first metal film and the second metal film,
   wherein the corrosion inhibitor comprises a carbon allotrope derivative;
   the carbon allotrope derivative comprises a plurality of hydrophilic groups selected from the group consisting of a carboxyl group, a carbonyl group, an epoxy group, a hydroxyl group, a hydroperoxy group, a peroxy group, and an isocyanate group;
   a carbon/oxygen atomic ratio (C:O) of the carbon allotrope derivative is 2:1 to 5:1;
   the carbon allotrope derivative is present in an amount of 1 ppm to 5000 ppm based on a total amount of the slurry composition; and
   the carbon allotrope derivative comprises an oxidized 3-dimensional carbon structure.

10. The slurry composition of claim 9, wherein the carbon allotrope derivative further comprises a graphene oxide and/or a fullerenol.

11. The slurry composition of claim 9, further comprising: polishing particles, each comprising a metal oxide.

12. The slurry composition of claim 9, wherein the oxidant comprises a periodate, and
   the carbon allotrope derivative further comprises a graphene oxide.

13. A slurry composition for polishing a plurality of metal films respectively comprising heterogeneous metals, the slurry composition comprising:
   polishing particles, which are present in an amount that is greater than 0 wt % and less than 15 wt % based on a total weight of the slurry composition;
   a corrosion inhibitor, which comprises a carbon allotrope derivative, and which is present in an amount of 1 ppm to 5000 ppm based on a total amount of the slurry composition;

an oxidant, which is present in an amount of 0.1 wt % to 5 wt % based on the total weight of the slurry composition; and water, wherein the carbon allotrope derivative comprises a plurality of hydrophilic groups selected from the group consisting of a carboxyl group, a carbonyl group, an epoxy group, a hydroxyl group, a hydroperoxy group, a peroxy group, and an isocyanate group;

a carbon/oxygen atomic ratio (C:O) of the carbon allotrope derivative is 2:1 to 5:1; and each of the polishing particles comprises silica.

14. The slurry composition of claim 13, wherein the carbon allotrope derivative is selected from the group consisting of a graphene oxide, an oxidized 3-dimensional carbon structure, a fullerenol, and a combination thereof.

15. The slurry composition of claim 13, wherein each of the polishing particles comprises a metal oxide.

16. The slurry composition of claim 13, wherein the slurry composition has a pH selected from a range of 7 to 11.

17. The slurry composition of claim 13, wherein the oxidant comprises sodium periodate ($NaIO_4$), and the carbon allotrope derivative comprises a graphene oxide.

18. The slurry composition of claim 13, wherein the carbon allotrope derivative is an oxidized 3-dimensional carbon structure.

* * * * *